United States Patent
Trivedi et al.

(10) Patent No.: US 9,106,179 B2
(45) Date of Patent: Aug. 11, 2015

(54) VOLTAGE-CONTROLLED OSCILLATORS AND RELATED SYSTEMS

(75) Inventors: Vishal P. Trivedi, Chandler, AZ (US); Kun-Hin To, Gilbert, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 351 days.

(21) Appl. No.: 13/051,611

(22) Filed: Mar. 18, 2011

(65) Prior Publication Data
US 2012/0235758 A1    Sep. 20, 2012

(51) Int. Cl.
| | |
|---|---|
| *H03B 5/08* | (2006.01) |
| *H03B 5/18* | (2006.01) |
| *H03B 5/12* | (2006.01) |
| *H03B 5/00* | (2006.01) |

(52) U.S. Cl.
CPC ............ *H03B 5/1228* (2013.01); *H03B 5/1215* (2013.01); *H03B 5/1243* (2013.01); *H03B 5/00* (2013.01); *H03B 5/08* (2013.01); *H03B 5/12* (2013.01); *H03B 5/1212* (2013.01); *H03B 5/1253* (2013.01)

(58) Field of Classification Search
CPC .......... H03B 5/00; H03B 5/12; H03B 5/1212; H03B 5/1228; H03B 5/1243; H03B 5/1215; H03B 5/1253; H03B 5/08
USPC ................... 331/117 R, 117 FE, 167, 107 SL
See application file for complete search history.

(56) References Cited

U.S. PATENT DOCUMENTS

| | | | |
|---|---|---|---|
| 5,629,652 A | 5/1997 | Weiss | |
| 5,821,820 A * | 10/1998 | Snider et al. | 331/48 |
| 5,838,207 A * | 11/1998 | Zhou et al. | 331/36 C |
| 5,929,716 A | 7/1999 | Komori et al. | |
| 6,046,647 A | 4/2000 | Nelson | |
| 6,169,461 B1 * | 1/2001 | Andoh et al. | 331/117 D |
| 6,469,586 B1 | 10/2002 | Rogers et al. | |
| 6,661,301 B2 * | 12/2003 | Traub | 331/117 R |
| 6,680,657 B2 | 1/2004 | Wang et al. | |
| 6,806,785 B2 * | 10/2004 | Traub | 331/108 C |
| 6,927,643 B2 * | 8/2005 | Lazarescu et al. | 331/186 |
| 6,946,924 B2 * | 9/2005 | Chominski | 331/177 V |
| 7,620,382 B2 | 11/2009 | Yamamoto | |
| 7,636,020 B1 | 12/2009 | Hwang | |

(Continued)

FOREIGN PATENT DOCUMENTS

WO    2010/092491 A2    8/2010

OTHER PUBLICATIONS

Hegazi, E., et al. "A Filtering Technique to Lower LC Oscillator Phase Noise," IEEE Journal of Solid-State Circuits, vol. 36, No. 12, Dec. 2001. pp. 1921-1930.

(Continued)

*Primary Examiner* — Robert Pascal
*Assistant Examiner* — Richard Tan
(74) *Attorney, Agent, or Firm* — Ingrassia Fisher & Lorenz, P.C.

(57) ABSTRACT

Apparatus are provided for voltage-controlled oscillators and related systems. An exemplary voltage-controlled oscillator includes an active-circuit arrangement that facilitates generation of an oscillating signal, and a resonator arrangement capacitively coupled to the active-circuit arrangement to influence an oscillation frequency of the oscillating signal based on a difference between a first control voltage and a second control voltage.

19 Claims, 2 Drawing Sheets

(56) References Cited

U.S. PATENT DOCUMENTS

| | | | |
|---|---|---|---|
| 7,688,153 | B2 | 3/2010 | Jacobsson et al. |
| 7,737,797 | B2 | 6/2010 | Shen |
| 2002/0113659 | A1* | 8/2002 | Scoggins ............... 331/117 R |
| 2004/0012450 | A1* | 1/2004 | Nguyen .................. 331/100 |
| 2005/0001691 | A1* | 1/2005 | Kim et al. .............. 331/117 R |
| 2005/0253659 | A1* | 11/2005 | Favrat et al. ............... 331/57 |
| 2005/0275478 | A1 | 12/2005 | Tsukizawa et al. |
| 2006/0049881 | A1 | 3/2006 | Rein et al. |
| 2006/0208819 | A1* | 9/2006 | Kobayashi ............... 331/167 |
| 2008/0174375 | A1* | 7/2008 | Nakamura et al. ......... 331/74 |
| 2008/0290957 | A1 | 11/2008 | Li et al. |
| 2008/0309435 | A1* | 12/2008 | Wu ........................... 333/204 |
| 2009/0167593 | A1* | 7/2009 | Storz et al. ............... 342/133 |
| 2009/0231051 | A1* | 9/2009 | Tokuyama ............ 331/117 R |
| 2009/0302958 | A1 | 12/2009 | Sakurai et al. |
| 2010/0289592 | A1 | 11/2010 | Lee et al. |
| 2011/0102093 | A1* | 5/2011 | El Rai et al. ........... 331/117 FE |
| 2011/0187420 | A1* | 8/2011 | Kuo et al. ................. 327/119 |
| 2012/0001699 | A1* | 1/2012 | Yang et al. ............ 331/117 FE |
| 2012/0161890 | A1* | 6/2012 | Li et al. ................ 331/117 FE |
| 2012/0169428 | A1* | 7/2012 | Maarefi et al. ........ 331/117 FE |

OTHER PUBLICATIONS

Salle, D., et al. "A Fully Integrated 77GHz FMCW Radar Transmitter Using a Fractional-N Frequency Synthesizer," Proceedings of the 6th European Radar Conference, Sep. 30-Oct. 2, 2009. pp. 149-152.

Shanan, H., et al. "A Technique to Reduce Flicker Noise Up-Conversion in CMOS LC Voltage-Controlled Oscillators," 30th European Solid-State Circuits Conference, Sep. 21-23, 2004. pp. 123-126.

J.H.C.Zhan, J.S.Duster, and K.T.Kornegay, "A Comparative Study of MOS VCOs for Low Voltage High Performance Operation," Proc. of 2004 Int. Symp. on Low Power Electronics and Design, pp. 244-247.

Zhan, J.H.C., et al. "A Comparative Study of Common MOS VCO Topologies," downloaded from http://domino.watson.ibm.com/acas/w3www_acas.nsf/images/projects_03.04/$FILE/kornegay.pdf.

USPTO "Non-Final Office Action" mailed Oct. 19, 2012; U.S. Appl. No. 13/250,385, filed Sep. 30, 2011.

Chaivipas, W., et al., "Fine and Wide Frequency Tuning Digital Controlled Oscillators Utilizing Capacitance Position Sensitivity in Distribute Resonators", 2007 IEEE Asian Solid-State Circuits Conference, Nov. 2007, pp. 424-427.

European Patent Office, European Search Report for Application No. 12185914.4-180512575259 dated Nov. 12, 2013.

USPTO, Notice of Allowance and Fee(s) Due for U.S. Appl. No. 13/250,385, mailed Aug. 28, 2013.

http:/academic.udayton.edu/lenoPedrotti/text232/ch8.pdf.

USPTO, Response to Office Action for U.S. Appl. No. 13/250,385, mailed Jan. 18, 2013.

USPTO, Office Action for U.S. Appl. No. 13/250,385, mailed Mar. 25, 2013.

USPTO, Response to Office Action for U.S. Appl. No. 13/250,385, mailed Jun. 25, 2013.

USPTO, Office Action for U.S. Appl. No. 13/485,742 mailed Jan. 3, 2014.

USPTO, Response to Office Action for U.S. Appl. No. 13/485,742 mailed Apr. 3, 2014.

USPTO, Office Action for U.S. Appl. No. 13/485,742 mailed Aug. 1, 2014.

USPTO, Response to Office Action for U.S. Appl. No. 13/485,742 mailed Nov. 3, 2014.

USPTO, Office Action for U.S. Appl. No. 13/485,742 mailed Feb. 13, 2015.

Utility U.S. Appl. No. 13/485,742, filed May 31, 2012.

\* cited by examiner

VOLTAGE-CONTROLLED OSCILLATORS AND RELATED SYSTEMS

TECHNICAL FIELD

Embodiments of the subject matter described herein relate generally to electronic circuits, and more particularly, embodiments of the subject matter relate to voltage-controlled oscillators and related circuit topologies and systems.

BACKGROUND

Voltage-controlled oscillators (VCOs) are commonly used to produce an oscillating signal that oscillates at a desired frequency in response to an applied voltage (or control voltage). For example, phase-locked loops (PLLs) may utilize a VCO to generate a signal having a particular oscillation frequency. In most systems, the VCO is designed to accommodate a range of possible oscillation frequencies over a predetermined input voltage range. Many VCOs include a number of transistors or other semiconductor devices, such as varactors, suitably configured to create an electronic oscillator. However, process, voltage, and temperature (PVT) variations may affect the operating parameters for the components that comprise the VCO, which in turn, affect the range of oscillation frequencies achievable by the VCO over the input voltage range. For example, with conventional cross-coupled VCO topologies that utilize varactors to tune the oscillation frequency, variations in the supply voltage may undesirably vary the capacitance of one or more of the varactors, thereby reducing or otherwise shifting the range of oscillation frequencies that the VCO is capable of oscillating at. As the supply voltage is reduced, the effects of supply voltage variations are exacerbated.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to voltage-controlled oscillators (VCOs) capable of achieving a relatively wide bandwidth tuning range with relatively low susceptibility to supply voltage variations. As described in greater detail below, a cross-coupled active-circuit arrangement and a resonator arrangement are capacitively coupled in a manner that isolates the resonator arrangement from the supply voltage that biases the transistors of the cross-coupled oscillator arrangement. In this manner, the supply voltage (and low frequency variations in the supply voltage) do not influence the capacitance of the variable capacitance elements (or varactors) of the resonator arrangement, and thus, do not appreciably influence the tuning range and/or resonant frequencies provided by the resonator arrangement. Additionally, transmission lines may be utilized to isolate the active-circuit arrangement and the resonator arrangement from the supply voltage at radio frequency (RF) oscillation frequencies. As a result, any variations in the supply voltage do not appreciably influence the capacitance of the variable capacitance elements.

Figure 1:
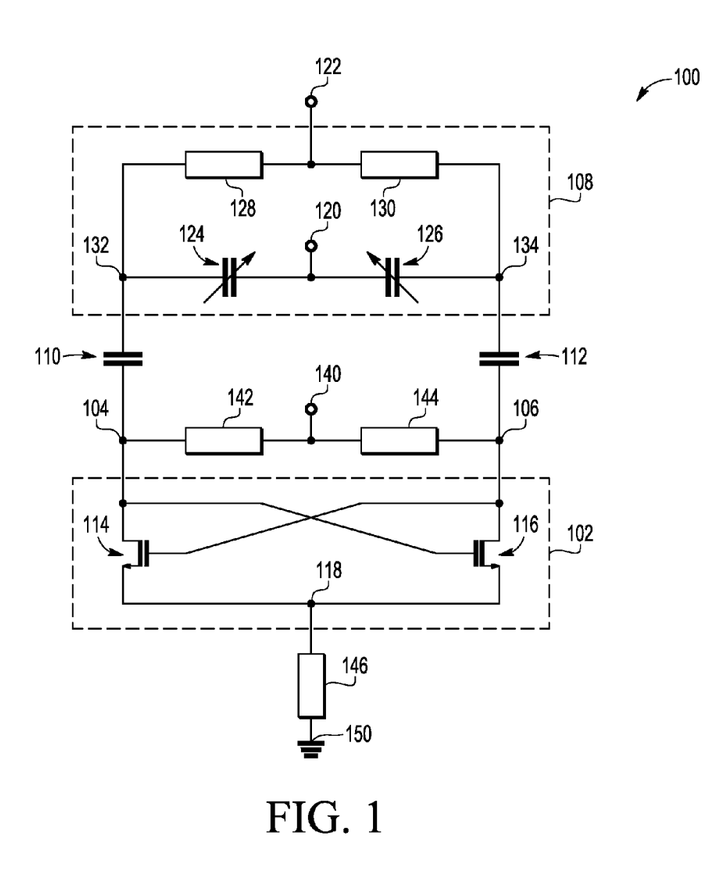
FIG. 1 is a schematic view of a voltage-controlled oscillator module in accordance with one embodiment of the invention.

FIG. 1 depicts an exemplary embodiment of a voltage-controlled oscillator module 100 including, without limitation, an active-circuit arrangement 102 configured to facilitate generation of a pair of oscillating signals at a pair of nodes 104, 106, a resonator arrangement 108, and a pair of capacitive elements 110, 112 coupled between the nodes 104, 106 of the active-circuit arrangement 102 and the resonator arrangement 108. The resonator arrangement 108 is capable of being tuned to a particular resonant frequency from a range of possible resonant frequencies, wherein the oscillation frequency of the oscillating signals at the nodes 104, 106 is governed or otherwise influenced by the tuned resonant frequency provided by the resonator arrangement 108. As used herein, "oscillation frequency," "oscillating frequency," and variants thereof should be understood as referring to the frequency of the oscillating signals at the nodes 104, 106. Furthermore, "corresponding to" and other words of similar import may be used herein to describe the relationship between the oscillation frequency and the tuned resonant frequency, and should not be construed as implying or otherwise requiring the oscillation frequency be equal to the tuned resonant frequency. In practice, various circuit level effects, such as component variations or parasitic capacitances, inductances, and/or resistances typically result in the oscillation frequency being different from the tuned resonant frequency, and in practice, the oscillation frequency and the tuned resonant frequency may differ by as much as thirty to fifty percent or more. As described in greater detail below, the capacitive elements 110, 112 capacitively couple the resonator arrangement 108 to the nodes 104, 106 of the active-circuit arrangement 102 in a manner that isolates the resonator arrangement 108 from the voltage at node 140 without appreciably impacting the resonant frequencies capable of being provided by the resonator arrangement 108.

It should be understood that FIG. 1 is a simplified representation of a VCO module 100 for purposes of explanation and ease of description, and FIG. 1 is not intended to limit the application or scope of the subject matter in any way. Thus, although FIG. 1 depicts direct electrical connections between circuit elements and/or terminals, alternative embodiments may employ intervening circuit elements and/or components while functioning in a substantially similar manner. For convenience, but without limitation, the subject matter may be described herein in the context of oscillating output signals being taken from or otherwise provided at nodes 104, 106. As described in greater detail below, the capacitive elements 110, 112 are effectively short-circuits at the oscillation frequency of the oscillating signals at nodes 104, 106, such that oscillating signals having their oscillation frequency governed or otherwise influenced by the tuned resonant frequency provided by the resonator arrangement 108 are also present or otherwise provided at nodes 132, 134, regardless of whether the nodes 104, 106 are being utilized as the output nodes of the VCO module 100. Accordingly, in other embodiments, oscillating output signals may be taken from nodes 132, 134 of the VCO module 100. Thus, although nodes 104, 106 may alternatively be referred to herein as output nodes of the VCO module 100 for purposes of explanation, it should be appreciated that in other embodiments, nodes 132, 134 may function as the output nodes of the VCO module 100.

In the illustrated embodiment, the active-circuit arrangement 102 is realized as cross-coupled oscillator arrangement that includes a pair of cross-coupled transistors 114, 116 configured to facilitate the oscillating signals at the output nodes 104, 106. In this regard, the oscillating signals at the output nodes 104, 106 are components of a differential oscillating signal, that is, the phase difference between the first oscillating signal at the first output node 104 and the second oscillating signal at the second output node 106 is substantially equal to 180°. In other words, the first oscillating signal at the first output node 104 is the logical inverse of the second oscillating signal at the second output node 106. As illustrated in FIG. 1, for an implementation using n-type transistors, the drain terminal of the first transistor 114 and the gate terminal of the second transistor 116 are each connected to the first output node 104, and the gate terminal of the first transistor 114 and the drain terminal of the second transistor 116 are each connected to the second output node 106. The source terminals of the transistors 114, 116 are connected to one another at a common source node 118, such that the gate and drain voltages of the transistors 114, 116 are all referenced relative to the same source voltage. As described in greater detail below, the output nodes 104, 106 are coupled to a node 140 configured to receive a positive reference voltage (or supply voltage) for the VCO module 100, and the common source node 118 is coupled to a node 150 configured to receive a ground reference voltage for the VCO module 100, wherein the voltage at node 140 functions as a bias voltage that biases the transistors 114, 116 in the saturation region, which results in the transistors 114, 116 oscillating between the on and off states at the tuned resonant frequency provided by the resonator arrangement 108 by virtue of the cross-coupled configuration. It should be noted that although FIG. 1 depicts an implementation using n-type MOSFETs (e.g., NMOS) for the active-circuit arrangement 102, numerous equivalent circuits may be implemented (e.g., using bipolar junction transistors or PMOS transistors for the active-circuit arrangement 102 with ground and supply terminals swapped) or the active-circuit arrangement 102 may be implemented in a complementary manner (e.g., using both NMOS and PMOS transistors).

As described above, the resonator arrangement 108 is capable of being tuned to a particular resonant frequency from a range of possible resonant frequencies, wherein the tuned resonant frequency dictates the oscillation frequency of the oscillating signals at the output nodes 104, 106. In exemplary embodiment, the resonator arrangement 108 is coupled to a first control voltage node 120 configured to receive a first control voltage and a second control voltage node 122 configured to receive a second control voltage, wherein the tuned resonant frequency of the resonator arrangement 108 is based on the voltage difference between the first control voltage at node 120 and the second control voltage at node 122.

As illustrated in FIG. 1, in an exemplary embodiment, the resonator arrangement 108 is realized as a tank circuit including a first variable capacitance element 124, a second variable capacitance element 126, a first inductive element 128, and a second inductive element 130. In the illustrated embodiment, the first variable capacitance element 124 is realized as a varactor having its cathode terminal connected to the first control voltage node 120, wherein the first inductive element 128 is connected between the second control voltage node 122 and the anode terminal of the first variable capacitive element 124 at node 132. In a similar manner, the second variable capacitance element 126 is realized as a varactor having its cathode terminal connected to the first control voltage node 120, wherein the second inductive element 130 is connected between the second control voltage node 122 and the anode terminal of the second variable capacitance element 126 at node 134. For convenience, but without limitation, the variable capacitance elements 124, 126 may alternatively be referred to herein as varactors. The direct current (DC) voltage difference between the first control voltage at node 120 and the second control voltage at node 122 is applied across the varactors 124, 126 to control the capacitance of the varactors 124, 126, and thereby, the resonant frequency provided by the resonator arrangement 108. In this regard, it should be noted by virtue of the resonator arrangement 108 having two control voltage nodes 120, 122, a wider range of voltages may be applied across the varactors 124, 126 (e.g., positive and negative voltages may be applied across the varactors 124, 126). Thus, when the variable capacitive elements 124, 126 are realized as MOS varactors, the varactors 124, 126 are capable of providing a wider range of possible capacitance values and thereby increasing the range of possible resonant frequencies for the resonator arrangement 108.

In an exemplary embodiment, the range of possible capacitances capable of being provided by the varactors 124, 126 with respect to the range of possible control voltages at the control voltage nodes 120, 122 and the inductances of the inductive elements 128, 130 are chosen to provide a desired range of possible resonant frequencies for the resonator arrangement 108. For example, in accordance with one embodiment, the inductive elements 128, 130 have an inductance of about 100 picohenries and the varactors 124, 126 are designed to have a capacitance of about 40 femtofarads to about 100 femtofarads over a control voltage differential from about −2.5 Volts to about 2.5 Volts to provide a range of possible oscillation frequencies for the VCO module 100 of about 36 GHz to about 46 GHz. In an exemplary embodiment, the inductive elements 128, 130 are realized as transmission lines configured to provide the desired inductance.

As illustrated in FIG. 1, the first capacitive element 110 is connected between the first output node 104 of the active-circuit arrangement 102 and node 132 of the resonator arrangement 108, and the second capacitive element 112 is connected between the second differential output node 106 of the active-circuit arrangement 102 and node 134 of the resonator arrangement 108. In this manner, the active-circuit arrangement 102 and the resonator arrangement 108 are capacitively coupled, that is, the active-circuit arrangement 102 and the resonator arrangement 108 are coupled via intervening capacitive elements 110, 112 configured electrically in series between the respective nodes 132, 134 of the resonator arrangement 108 and the respective output nodes 104, 106, such that the nodes 132, 134 of the resonator arrangement 108 are not directly connected to the output nodes 104, 106. In an exemplary embodiment, the capacitances of the capacitive elements 110, 112 are chosen such that the capacitive elements 110, 112 are effectively short-circuits (i.e., relatively low impedance) over the range of possible resonant frequencies for the resonator arrangement 108. For example, for the above described embodiment of a resonator arrangement 108 configured to provide a range of possible resonant frequencies of about 36 GHz to 46 GHz, the capacitive elements 110, 112 may be realized as capacitors having a capacitance of about 300 femtofarads or higher, such that the capacitive elements 110, 112 have relatively low impedance (e.g., about 15Ω or less) at or above 36 GHz. In this regard, the resonator arrangement 108 may be understood as being AC-coupled to the active-circuit arrangement 102, as the capacitive elements 110, 112 effectively isolate DC voltages or other signals at the output nodes 104, 106 having frequencies below the range of possible resonant frequencies for the resonator arrangement 108 from nodes 132, 134 of the resonator arrangement 108. By virtue of the capacitive elements 110, 112 being effectively short-circuits over the range of possible resonant frequencies for the resonator arrangement 108, the capacitive elements 110, 112 have minimal influence on the oscillating frequency of the oscillating signals at the output nodes 104, 106.

As described above, in an exemplary embodiment, the output nodes 104, 106 of the active-circuit arrangement 102 are coupled to a supply voltage node 140 configured to receive a supply voltage (or bias voltage) that biases the transistors 114, 116 to provide negative transconductance and facilitate generation of oscillating signals at the output nodes 104, 106 having an oscillation frequency corresponding to the tuned resonant frequency of the resonator arrangement 108. By virtue of the capacitive elements 110, 112 being effectively open circuits at lower frequencies (e.g., frequencies below the range of possible resonant frequencies provided by the resonator arrangement 108), the DC voltage at the supply voltage node 140 is effectively isolated from the nodes 132, 134 of the resonator arrangement 108, and thus, the supply voltage at node 140 is effectively isolated from the varactors 124, 126. As a result, variations in the supply voltage at the supply voltage node 140 are not transferred to nodes 132, 134, and thus, do not appreciably impact the voltages at the nodes 132, 134 of the resonator arrangement 108. Accordingly, the capacitances of the varactors 124, 126 are not influenced by the supply voltage at the supply voltage node 140 and the range of possible resonant frequencies for the resonator arrangement 108 is not influenced by variations in the supply voltage. Rather, the capacitances of the varactors 124, 126 are based on the voltage differential between the control voltages applied at the control voltage nodes 120, 122, as described above.

In an exemplary embodiment, a first inductive element 142 is connected between the supply voltage node 140 and the first output node 104 and a second inductive element 144 is connected between the supply voltage node 140 and the second output node 106. In accordance with one or more embodiments, the first and second inductive elements 142, 144 are each realized as transmission line elements configured as a quarter wave impedance transformer at the oscillating frequency of the oscillating output signals at the output nodes 104, 106, such that the transmission line elements 142, 144 terminated at the supply voltage node 140 (which is effectively an RF ground) are effectively open circuits at the oscillating frequency. In this regard, the first and second transmission line elements 142, 144 may each be configured as a quarter wave impedance transformer at the oscillating frequency at the midpoint of the range of possible oscillating frequencies capable of being provided by the VCO module 100. For example, for capacitance/inductance value for range from 36 GHz to about 46 GHz, the first and second transmission line elements 142, 144 may be realized as quarter wave impedance transformers at 41 GHz). When realized as quarter wave impedance transformers at the oscillating frequency, the first and second transmission line elements 142, 144 further isolate the supply voltage node 140 from the nodes 132, 134 of the resonator arrangement 108 without influencing the oscillation frequency of the differential output signals produced by the active-circuit arrangement 102. It should be appreciated that the first and second transmission line elements 142, 144 are not intended to be limited to quarter wave impedance transformers at the oscillation frequency, and in other practical embodiments, the impedance of the first and second transmission line elements 142, 144 may be chosen to influence the oscillation frequency (or the range thereof) for the VCO module 100 to suit the needs of a particular application.

In an exemplary embodiment, a third transmission line element 146 is connected between the common source node 118 and the ground voltage node 150. In accordance with one or more embodiments, the third transmission line element 146 is configured as a quarter wave impedance transformer at twice the oscillating frequency for the oscillating output signals at the output nodes 104, 106 (e.g., a quarter wave impedance transformer at double the oscillating frequency at the midpoint of the range of possible resonant frequencies capable of being provided by the VCO module 100). In this regard, the third transmission line element 146 is effectively an open circuit at the second harmonic of the oscillating frequency to reduce the phase noise of the VCO module 100. It should be appreciated that the third transmission line element 146 is not intended to be limited to a quarter wave impedance transformer at the twice the oscillation frequency of the VCO module 100, and in other practical embodiments, the impedance of the third transmission line element 146 may be chosen to target different harmonics of the oscillation frequency, or may otherwise be modified to influence the oscillation frequency of the VCO module 100 to suit the needs of a particular application. Additionally, in other embodiments of the VCO module 100, the third transmission line element 146 may not be present, that is, the common source node 118 (i.e., the source terminals of transistors 114, 116) may be connected directly to the ground voltage node 150.

Figure 2:
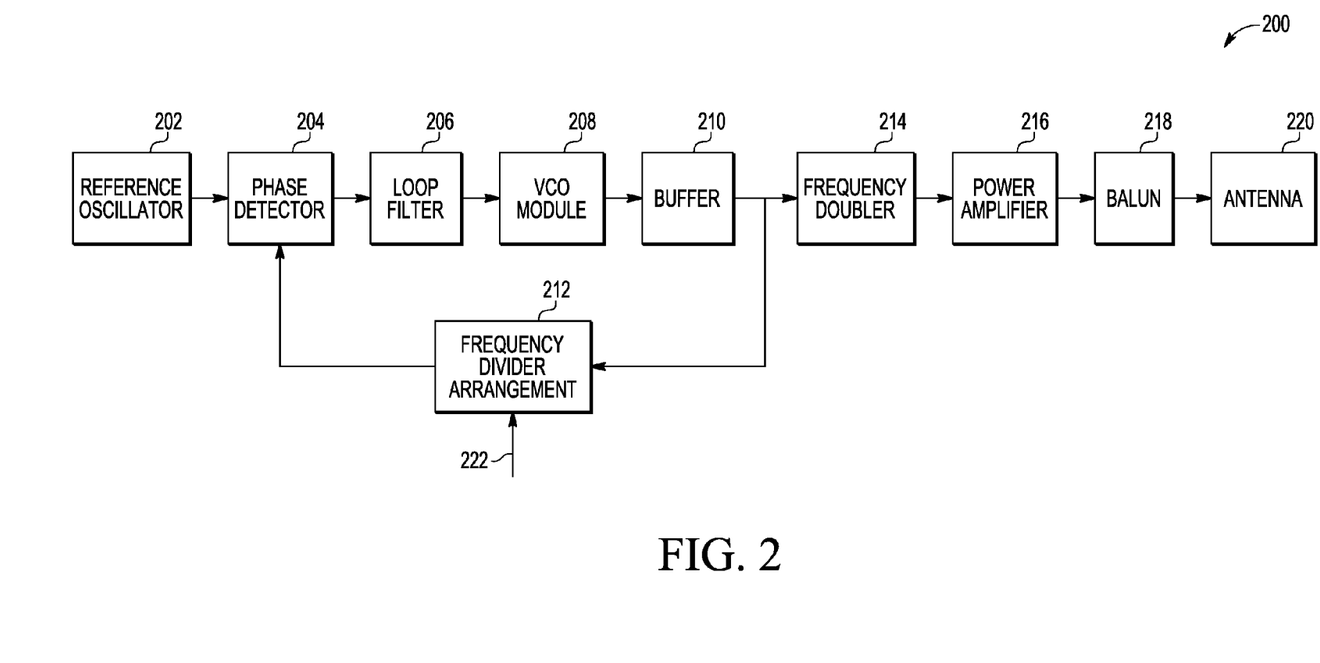
FIG. 2 is a block diagram of a transmitter system suitable for use with the voltage-controlled oscillator module of FIG. 1 in accordance with one embodiment of the invention.

FIG. 2 depicts an exemplary embodiment of a transmitter system 200 suitable for use with the VCO module 100 of FIG. 1. It should be understood that FIG. 2 is a simplified representation of a transmitter system for purposes of explanation and ease of description, and FIG. 2 is not intended to limit the application or scope of the subject matter in any way. Along these lines, it will be appreciated that the transmitter system 200 of FIG. 2 is merely one exemplary system that may utilize the VCO module 100 of FIG. 1, and the VCO module 100 of FIG. 1 may be utilized in a variety of different electrical systems and the VCO module 100 of FIG. 1 is not intended to be limited to implementation in any particular system.

The illustrated embodiment of the transmitter system 200 includes, without limitation, a reference oscillator 202, a phase detector 204, a loop filter 206, a VCO module 208, a buffer 210, a frequency divider arrangement 212, a frequency doubler 214, a power amplifier 216, a balun 218, and an antenna 220. In the illustrated embodiment of FIG. 2, the reference oscillator 202, the phase detector 204, the loop filter 206, the VCO module 208, the buffer 210, and the frequency divider arrangement 212 are configured as a phase-locked loop (PLL) that produces a frequency modulated oscillating signal having a desired oscillation frequency based on an input signal provided to an input 222 of the transmitter system 200, as described in greater detail below. In accordance with one or more embodiments, the transmitter system 200 is configured for automotive radar applications, wherein the VCO module 208 is configured for oscillation frequencies within the range of about 38 GHz to about 41 GHz and the frequency modulated signals transmitted by the antenna 220 have a frequency in the range of about 76 GHz to about 81

GHz. It should be understood that FIG. 2 is a simplified representation of a transmitter system 200 for purposes of explanation and ease of description, and FIG. 2 is not intended to limit the application or scope of the subject matter described herein in any way.

In the illustrated embodiment, the reference oscillator 202 is realized as an oscillator that generates a reference signal having a fixed reference frequency, such as, for example, a crystal oscillator. The phase detector 204 is coupled to the reference oscillator 202 and the frequency divider arrangement 212, and the phase detector 204 compares the reference signal from the reference oscillator to the feedback signal from the frequency divider arrangement 212 and generates an error signal based on the difference between the frequencies and/or phases of the feedback signal and the reference signal. In accordance with one embodiment, the error signal from the phase detector 204 comprises an 'up' or 'down' pulse that produces a corresponding increase or decrease in a reference voltage differential provided to the VCO module 208 that is proportional to the duration of the pulse. The loop filter 206 comprises an analog filter that filters the error signal from the phase detector 204 to obtain a reference voltage differential which varies based on differences (e.g., in frequency and/or phase) between the reference signal and the feedback signal until the feedback signal is in phase-lock with or otherwise matches the reference signal. It will be appreciated that the loop filter 206 also provides a dominant pole for the PLL, thereby ensuring stability for the PLL. The buffer 210 is coupled to the output of the VCO module 208 and prevents the resulting load from the frequency divider arrangement 212 and/or frequency doubler 214 from undesirably impacting the oscillation frequency of the VCO module 208. The frequency divider arrangement 212 is coupled between the output of the VCO module 208 (via the buffer 210) and the input to the phase detector 204, and the frequency divider arrangement 212 is configured to generate or otherwise provide the feedback signal at a frequency that is equal to a fraction of the oscillation frequency of the oscillating signal(s) from the VCO module 208, wherein the fractional amount is determined based on the input signal provided at the input 222 of the transmitter system 200. In an exemplary embodiment, the frequency divider arrangement 212 is configured to support or otherwise implement frequency modulated continuous wave signals generated by the PLL that are representative of the input signal received at the input 222. In this regard, although not illustrated in FIG. 2, in practice, the frequency divider arrangement 212 may include modulators, ramp generators, and other components suitably configured to support frequency modulation, as will be appreciated in the art.

In an exemplary embodiment, the VCO module 208 is realized as a VCO module 100 as described above in the context of FIG. 1, wherein the reference voltage differential from the loop filter 206 is provided to the control voltage nodes 120, 122 to control the capacitance of the varactors 124, 126, and thereby, the oscillation frequency of the differential oscillating signals at the output nodes 104, 106, which are representative of frequency modulated signals to be transmitted by the transmitter system 200. It should be noted that in other embodiments, the VCO module 100 may be utilized in a non-differential manner and/or the PLL for the transmitter system 200 may be implemented in a non-differential manner by coupling only one of the control voltage nodes (e.g., control voltage node 120) to the output of the loop filter 206 while the other control voltage node (e.g., control voltage node 122) to a fixed reference voltage. In the illustrated embodiment, the output of the VCO module 208 (e.g., output nodes 104, 106) is coupled to the frequency doubler 214 (via buffer 210), which doubles the frequency of the differential oscillating signals received from the output nodes 104, 106. The output of the frequency doubler 214 is provided to a power amplifier 216, which amplifies the differential oscillating signals. The output of the power amplifier 216 is provided to the input of a balun 218, which is configured to convert the amplified differential oscillating signal to a single-ended oscillating signal with the same oscillating frequency. In an exemplary embodiment, the antenna 220 is realized as a conductive element that is coupled to the output of the balun 218 and configured to generate or otherwise produce electromagnetic waves at a frequency corresponding to the frequency of the single-ended oscillating signal received from the balun 218. In this manner, the antenna 220 transmits or otherwise emits an electromagnetic signal having a frequency that is influenced by the oscillating frequency of the oscillating signals provided by the VCO module 208, which in this example, corresponds to twice the oscillating frequency of the VCO module 208 by virtue of the frequency doubler 214. For example, if the VCO module 208 is producing oscillating signals with an oscillation frequency of 39 GHz, the antenna 220 transmits frequency modulated electromagnetic signals having a frequency of 78 GHz.

For the sake of brevity, conventional techniques related to electronic oscillators and/or VCOs, resonators and/or tank circuits, variable capacitance elements and/or varactors, field-effect transistors (FETs), analog circuit design, PLLs, transmitters, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

In conclusion, systems, devices, and apparatus configured in accordance with exemplary embodiments of the invention relate to:

In one embodiment, a voltage-controlled oscillator is provided. The voltage-controlled oscillator includes a first voltage node to receive a first voltage, a second voltage node to receive a second voltage, an active-circuit arrangement facilitating generation of an oscillating signal, and a resonator arrangement capacitively coupled to the active-circuit arrangement. The resonator arrangement is coupled to the first voltage node and the second voltage node to influence an oscillation frequency for the oscillating signal based on a difference between the first voltage and the second voltage. In one embodiment, the voltage-controlled oscillator further includes a capacitive element connected between the active-circuit arrangement and the resonator arrangement. The capacitive element is an effective short-circuit at the oscillation frequency and isolates the resonator arrangement from a third voltage to bias the active-circuit arrangement at a third voltage node. In one or more embodiments, active-circuit arrangement facilitates generation of the oscillating signal at a first node, the resonator arrangement is capacitively coupled to the active-circuit arrangement at the first node, wherein the active-circuit arrangement facilitates generation of a second oscillating signal having the oscillation frequency at a second node and the resonator arrangement is capacitively coupled to the active-circuit arrangement at the second node. In a further embodiment, a first capacitive element is connected between the first node and the resonator arrangement and a second capacitive element is connected between the second node and the resonator arrangement. In one embodiment, the voltage-controlled oscillator includes a third voltage node to receive a third voltage, a first inductive element connected between the third voltage node and the first node, and a second inductive element connected between the third voltage node and the second node, wherein the active-circuit arrangement includes a first transistor having a drain terminal connected to the first node and a gate terminal connected to the second node and a second transistor having a drain terminal connected to the second node and a gate terminal connected to the first node. In a further embodiment, the voltage-controlled oscillator includes a ground voltage node to receive a ground voltage and a third transmission line element connected between the ground voltage node and a common source node, wherein a source terminal of the first transistor is connected to a source terminal of the second transistor at the common source node. In another embodiment, the voltage-controlled oscillator includes a first capacitive element connected between the active-circuit arrangement and a first node of the resonator arrangement and a second capacitive element connected between the active-circuit arrangement and a second node of the resonator arrangement, wherein the resonator arrangement includes a first variable capacitance element connected between the first voltage node and the first node and a second variable capacitance element connected between the first voltage node and the second node. In yet another embodiment, the resonator arrangement further comprises a first inductive element connected between the second voltage node and the first node and a second inductive element connected between the second voltage node and the second node. In one embodiment, the first variable capacitance element is realized as a first varactor having its anode terminal connected to the first voltage node and its cathode terminal connected to the first node, and the second variable capacitance element is realized as a second varactor having its anode terminal connected to the first voltage node and its cathode terminal connected to the second node. In accordance with another embodiment, the voltage-controlled oscillator includes a ground voltage node to receive a ground voltage and a transmission line element connected between the ground voltage node and the active-circuit arrangement, wherein the transmission line element is configured as a quarter wave impedance transformer at twice the oscillation frequency.

In accordance with another exemplary embodiment, a voltage-controlled oscillator includes a first node to receive a first voltage, a second node to receive a second voltage, a third node to receive a third voltage, a fourth node for a first oscillating signal, a fifth node for a second oscillating signal, an active-circuit arrangement to facilitate the first oscillating signal and the second oscillating signal, the active-circuit arrangement being coupled to the first node, a resonator arrangement coupled to the second node and the third node, the resonator arrangement providing an oscillation frequency for the first oscillating signal and the second oscillating signal based on a voltage difference between the second voltage and the third voltage, a first capacitive element connected between the fourth node and the resonator arrangement, and a second capacitive element connected between the fifth node and the resonator arrangement. In one embodiment, the voltage-controlled oscillator includes a first transmission line element connected between the first node and the fourth node and a second transmission line element connected between the first node and the fifth node, wherein the first transmission line element and the second transmission line element are each configured as a quarter wave impedance transformer at the oscillation frequency. In another embodiment, the voltage-controlled oscillator includes a ground voltage node configured to receive a ground voltage and a third transmission line element connected between the ground voltage node and the active-circuit arrangement, wherein the third transmission line element is configured as a quarter wave impedance transformer at twice the oscillation frequency. In yet another embodiment, the resonator arrangement includes a first varactor connected between the second node and a sixth node, the first capacitive element being connected between the sixth node and the fourth node, a second varactor connected between the second node and a seventh node, the second capacitive element being connected between the seventh node and the fifth node, a first transmission line element connected between the third node and the sixth, and a second transmission line element connected between the third node and the seventh node. In yet another embodiment, the active-circuit arrangement includes a first transistor having a drain terminal connected to the fourth node and a gate terminal connected to the fifth node, and a second transistor having a drain terminal connected to the fifth node and a gate terminal connected to the fourth node, wherein a source terminal of the second transistor is connected to a source terminal of the first transistor.

In accordance with yet another exemplary embodiment, a voltage-controlled oscillator module for generating an oscillating signal includes an active-circuit arrangement coupled to a first voltage node to facilitate the oscillating signal at a first node, a transmission line element connected between the first voltage node and the first node, a resonator arrangement coupled to a second voltage node and a third voltage node, the resonator arrangement influencing an oscillation frequency of the oscillating signal based on a voltage difference between the second voltage node and the third voltage node, and a capacitive element connected between the first node and the resonator arrangement. In one embodiment, the active-circuit arrangement facilitates a second oscillating signal at a second node, a second transmission line element is connected between the first voltage node and the second node, and a second capacitive element is connected between the second node and the resonator arrangement. An exemplary transmitter including the voltage-controlled oscillator module includes an antenna coupled to the voltage-controlled oscillator module to transmit an electromagnetic signal having a frequency that is influenced by the oscillation frequency of the oscillating signal.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A voltage-controlled oscillator comprising:
   a first voltage node to receive a first voltage;
   a second voltage node to receive a second voltage;
   a third voltage node to receive a third voltage;
   an active-circuit arrangement facilitating generation of a first oscillating signal at a first output node and a second oscillating signal at a second output node, the active-circuit arrangement comprising:
      a first field-effect transistor having a first drain terminal connected to the first output node, a first gate terminal connected to the second output node, and a first source terminal; and
      a second field-effect transistor having a second drain terminal connected to the first gate terminal at the second output node, a second gate terminal connected to the first drain terminal at the first output node, and a second source terminal connected to the first source terminal;
   a resonator arrangement coupled to the first voltage node and the second voltage node to influence an oscillation frequency for the first oscillating signal and the second oscillating signal based on a difference between the first voltage and the second voltage, the resonator arrangement including a first inductive element coupled between the second voltage node and a first node and a second inductive element coupled between the second voltage node and a second node;
   a first capacitive element configured electrically in series between the first output node and the resonator arrangement;
   a second capacitive element configured electrically in series between the second output node and the resonator arrangement;
   a third inductive element connected between the first output node and the third voltage node; and
   a fourth inductive element connected between the second output node and the third voltage node, wherein:
      the resonator arrangement is capacitively coupled to the active-circuit arrangement via the first capacitive element and the second capacitive element;
      each of the first capacitive element and the second capacitive element has a low impedance at the oscillation frequency; and
      the third inductive element and the fourth inductive element are effectively open circuits at the oscillation frequency.

2. The voltage-controlled oscillator of claim 1, wherein each of the first capacitive element and the second capacitive element is an effective short-circuit at the oscillation frequency.

3. The voltage-controlled oscillator of claim 1, the third voltage biasing the active-circuit arrangement, wherein the first capacitive element and the second capacitive element isolate the resonator arrangement from the third voltage.

4. The voltage-controlled oscillator of claim 3, wherein variations in the third voltage do not influence a range of resonant frequencies provided by the resonator arrangement.

5. The voltage-controlled oscillator of claim 1, further comprising:
   a ground voltage node to receive a ground voltage; and
   a transmission line element connected between the ground voltage node and a common source node, wherein the first source terminal is connected to the second source terminal at the common source node.

6. The voltage-controlled oscillator of claim 1, the first capacitive element being connected between the active-circuit arrangement and the first node of the resonator arrangement and the second capacitive element being connected between the active-circuit arrangement and the second node of the resonator arrangement, wherein the resonator arrangement further comprises:
   a first variable capacitance element connected between the first voltage node and the first node of the resonator arrangement; and
   a second variable capacitance element connected between the first voltage node and the second node of the resonator arrangement.

7. The voltage-controlled oscillator of claim 6, wherein:
   the first inductive element is connected between the second voltage node and the first node of the resonator arrangement; and
   the second inductive element is connected between the second voltage node and the second node of the resonator arrangement.

8. The voltage-controlled oscillator of claim 7, wherein:
   the first variable capacitance element comprises a first varactor having its anode terminal connected to the first voltage node and its cathode terminal connected to the first node of the resonator arrangement; and
   the second variable capacitance element comprises a second varactor having its anode terminal connected to the first voltage node and its cathode terminal connected to the second node of the resonator arrangement.

9. The voltage-controlled oscillator of claim 1, further comprising:
   a ground voltage node to receive a ground voltage; and
   a transmission line element connected between the ground voltage node and the active-circuit arrangement, wherein the transmission line element is configured as a quarter wave impedance transformer at twice the oscillation frequency.

10. The voltage-controlled oscillator of claim 1, wherein each of the first capacitive element and the second capacitive element has an impedance of 15Ω or less at the oscillation frequency.

11. The voltage-controlled oscillator of claim 1, wherein each of the first capacitive element and the second capacitive element has minimal influence on the oscillation frequency.

12. The voltage-controlled oscillator of claim 1, wherein:
   the third inductive element comprises a first transmission line element connected between the first output node and the third voltage node; and the fourth inductive element comprises a second transmission line element connected between the second output node and the third voltage node, wherein the first transmission line element and the second transmission line element are effectively open circuits at the oscillation frequency.

13. The voltage-controlled oscillator of claim 12, further comprising:
a ground voltage node to receive a ground voltage; and
a third transmission line element connected between the ground voltage node and a common source node, wherein:
the first source terminal is connected to the second source terminal at the common source node; and
the third transmission line element is configured as a quarter wave impedance transformer at twice the oscillation frequency.

14. The voltage-controlled oscillator of claim 1, wherein:
each of the first capacitive element and the second capacitive element has an impedance of 15Ω or less at the oscillation frequency; and
the oscillation frequency is greater than 36 GHz.

15. A voltage-controlled oscillator comprising:
a first node to receive a first voltage;
a second node to receive a second voltage;
a third node to receive a third voltage;
a first output node for a first oscillating signal;
a second output node for a second oscillating signal;
an active-circuit arrangement coupled to the first output node and the second output node to facilitate the first oscillating signal and the second oscillating signal, the active-circuit arrangement being coupled to the first node, the active-circuit arrangement comprising:
a first field-effect transistor having a first drain terminal connected to the first output node, a first gate terminal connected to the second output node, and a first source terminal; and
a second field-effect transistor having a second drain terminal connected to the first gate terminal at the second output node, a second gate terminal connected to the first drain terminal at the first output node, and a second source terminal connected to the first source terminal;
a resonator arrangement coupled to the second node and the third node, the resonator arrangement providing an oscillation frequency for the first oscillating signal and the second oscillating signal based on a voltage difference between the second voltage and the third voltage, the resonator arrangement including a first inductive element coupled between the third node and a fourth node and a second inductive element coupled between the third node and a fifth node;
a first capacitive element electrically in series between the first output node and the resonator arrangement;
a second capacitive element electrically in series between the second output node and the resonator arrangement, wherein the first and second capacitive elements are effectively short-circuits at the oscillation frequency;
a first transmission line element connected between the first node and the first output node; and
a second transmission line element connected between the first node and the second output node, wherein the first transmission line element and the second transmission line element are effectively open circuits at the oscillation frequency.

16. The voltage-controlled oscillator of claim 15, wherein the first transmission line element and the second transmission line element are each configured as a quarter wave impedance transformer at the oscillation frequency.

17. The voltage-controlled oscillator of claim 15, wherein the resonator arrangement includes: a first varactor connected between the second node and the fourth node, the first capacitive element being connected between the fourth node and the first output node; and a second varactor connected between the second node and the fifth node, the second capacitive element being connected between the fifth node and the second output node; and the first inductive element comprises a third transmission line element connected between the third node and the fourth node; and the second inductive element comprises a fourth transmission line element connected between the third node and the fifth node.

18. A voltage-controlled oscillator module to generate a first oscillating signal at a first output node and a second oscillating signal at a second output node, the voltage-controlled oscillator module comprising:
an active-circuit arrangement coupled to the first output node and the second output node to facilitate the first oscillating signal at the first output node and the second oscillating signal at the second output node, the active-circuit arrangement comprising:
a first field-effect transistor having a first drain terminal connected to the first output node, a first gate terminal connected to the second output node, and a first source terminal; and
a second field-effect transistor having a second drain terminal connected to the first gate terminal at the second output node, a second gate terminal connected to the first drain terminal at the first output node, and a second source terminal connected to the first source terminal;
a first transmission line element electrically in series between a first voltage node and the first output node, wherein the first transmission line element is effectively an open circuit at an oscillation frequency of the first oscillating signal;
a second transmission line element electrically in series between the first voltage node and the second output node, wherein the second transmission line element is effectively an open circuit at the oscillation frequency of the second oscillating signal;
a resonator arrangement coupled to a second voltage node and a third voltage node, the resonator arrangement influencing the oscillation frequency of the first oscillating signal and the second oscillating signal based on a voltage difference between the second voltage node and the third voltage node, the resonator arrangement including a first inductive element coupled between the second voltage node and a first node of the resonator arrangement and a second inductive element coupled between the second voltage node and a second node of the resonator arrangement;
a first capacitive element electrically in series between the first output node and the first node of the resonator arrangement, the first capacitive element having low impedance at the oscillation frequency; and
a second capacitive element electrically in series between the second output node and the second node of the resonator arrangement, the second capacitive element having low impedance at the oscillation frequency.

19. A transmitter including the voltage-controlled oscillator module of claim 18, further comprising an antenna coupled to the voltage-controlled oscillator module to transmit an electromagnetic signal having a frequency influenced by the oscillation frequency.

* * * * *